United States Patent [19]

Edelson

[11] 4,081,706

[45] Mar. 28, 1978

[54] OSCILLATORY CIRCUIT FOR AN ULTRASONIC CLEANING DEVICE WITH FEEDBACK FROM THE PIEZOELECTRIC TRANSDUCER

[75] Inventor: Leon F. Edelson, Los Angeles, Calif.

[73] Assignee: Delta Sonics, Inc., Long Beach, Calif.

[21] Appl. No.: 734,385

[22] Filed: Oct. 21, 1976

[51] Int. Cl.[2] .......... H01L 41/04

[52] U.S. Cl. .......... 310/316

[58] Field of Search .......... 310/8.1, 26, 116; 318/116, 118

[56] References Cited

U.S. PATENT DOCUMENTS

| | | | |
|---|---|---|---|
| 3,293,456 | 12/1966 | Shoh | 318/116 X |
| 3,432,691 | 3/1969 | Shoh | 310/8.1 |
| 3,681,626 | 8/1972 | Puskas | 310/8.1 |
| 3,842,340 | 10/1974 | Brandquist | 318/116 X |
| 3,931,533 | 1/1976 | Raso et al. | 310/8.1 |
| 3,975,650 | 8/1976 | Payne | 310/8.1 |

*Primary Examiner*—Mark O. Budd

*Attorney, Agent, or Firm*—Fulwider, Patton, Rieber, Lee & Utecht

[57] ABSTRACT

An improved oscillatory circuit in which the output of a radio frequency transformer is coupled from a half bridge squarewave amplifier to piezoelectric ultrasonic transducers through a serially connected feedback network. The feedback network employs a resistance connected in parallel with the serially connected combination of a capacitance, a feedback inductance and a feedback transformer. The improved feedback network provides a variable phase shift in feedback current to the half bridge squarewave amplifier tending to hold the frequency generated therein at a target frequency above anti-resonance.

6 Claims, 2 Drawing Figures

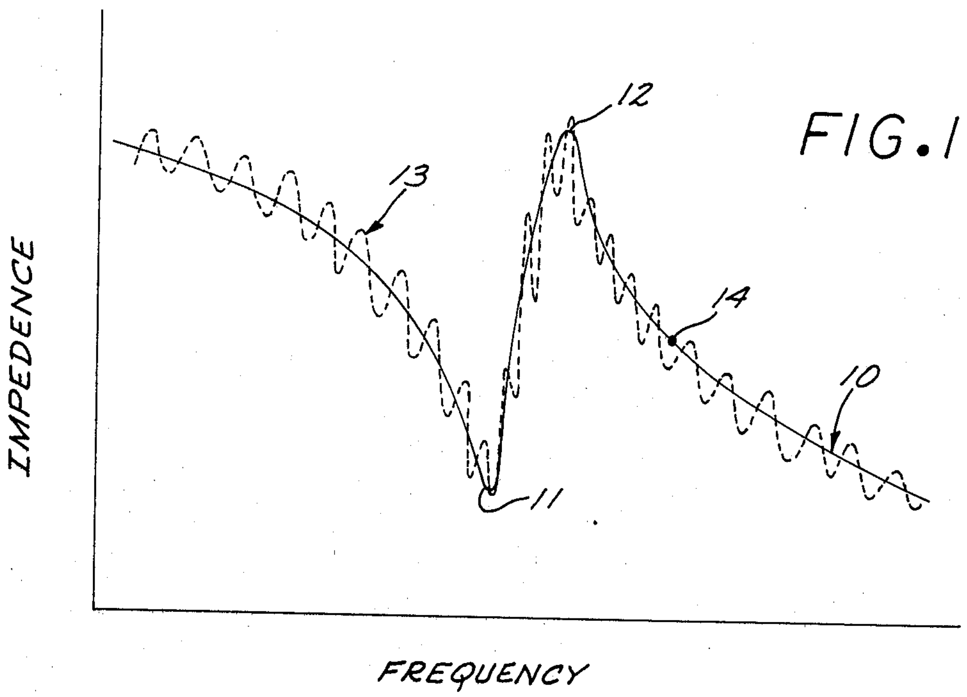
FIG. 1
FIG. 2
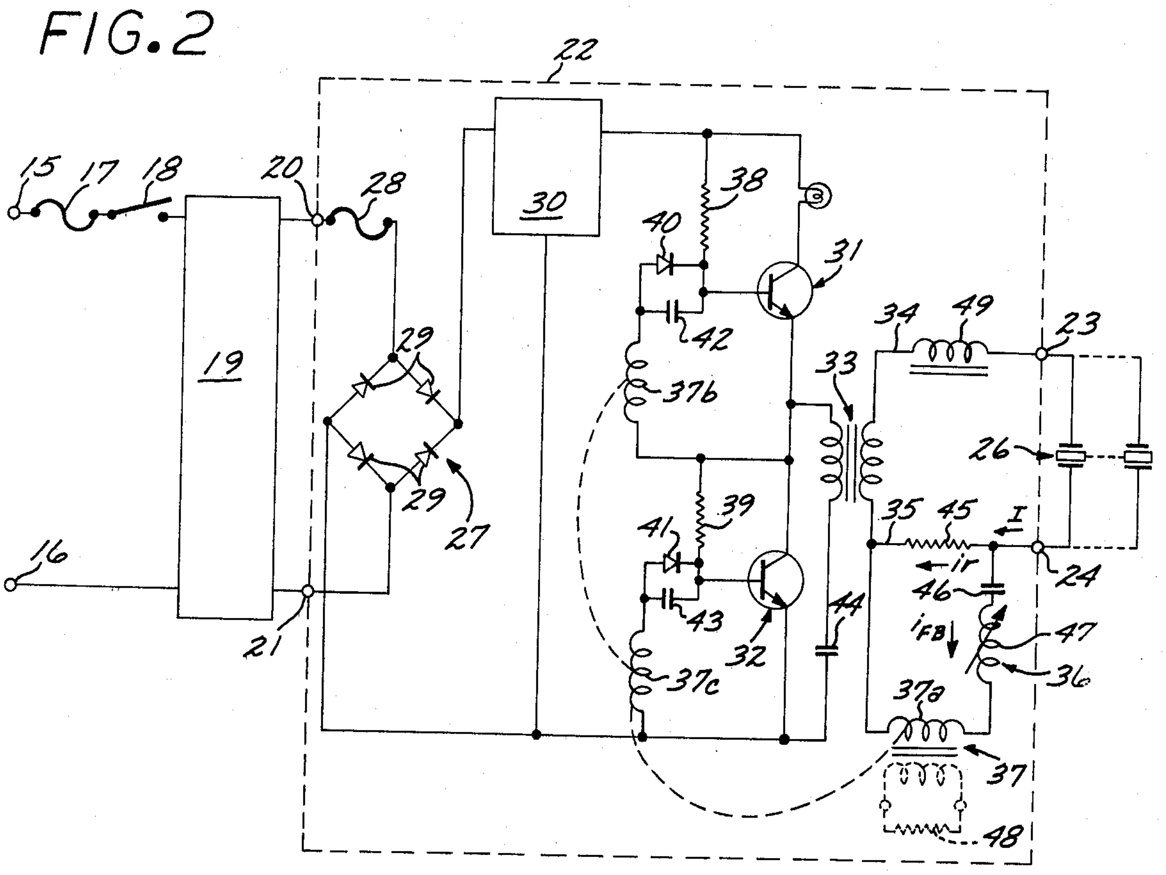

OSCILLATORY CIRCUIT FOR AN ULTRASONIC CLEANING DEVICE WITH FEEDBACK FROM THE PIEZOELECTRIC TRANSDUCER

FIELD OF THE INVENTION

The present invention relates to oscillatory circuits for generating ultrasonic frequency vibrations in an ultrasonic cleaning device.

BACKGROUND OF THE INVENTION

In the past various circuits have been employed in association with frequency generation in an ultrasonic cleaning device. Some of these prior art devices generate ultrasonic vibrations using a half bridge square wave amplifier to drive a radio frequency transformer, which in turn provides a feedback to control the half bridge squarewave amplifier. Most cleaning devices include a plurality of piezoelectric ultrasonic transducer physically connected to the underside of a thin metal bottom of a tank containing liquid for cleaning objects in the tank. If a plurality of such transducers are employed, they are connected in parallel across the output leads of the RF transformer. In addition, a feedback network is provided to derive signals from the RF transformer and operate the half bridge amplifier.

Certain design features of conventional frequency generators contribute to specific deficiencies in these devices, however. Specifically, the output frequency of the RF transformer is not uniform, but varies considerably. Since a piezoelectric ultrasonic cleaning tank is a difficult type of a electric load to power, the impedance of the piezoelectric transducers associated with the tank varies rapidly and in a complex way with frequency, with the level of fluid in the tank, and with size and shape of the work pieces in the fluid.

It is desirable to stablize the RF transformer output frequency yet minimize the power required to operate the system. Accordingly, some ultrasonic cleaners have been designed to be driven at minimum electrical impedance, which occurs at approximately the frequency of mechanical resonance between the mass of mechanical and structural parts external to the piezoelectric transducers and the stiffness of the intergal parts of the transducer. This is the resonant frequency of the system. Other systems are designed for operation at a slightly higher frequency where the force needed to move the mass of the external parts is greater than the force needed to overcome the stiffness of the crystal assembly. Electrically, this appears as though the transducer is inductive. At the same time, a gnerator must supply current to the capacitance of the piezoelectric crystals. Where the inductive and capacitive currents are equal, the transducer impedance is at a maximum. The frequency at which this occurs is called anti-resonance, as distinguished from mechanical resonance.

It is extremely difficult to maintain operation of a generator at either resonance or anti-resonance, however. Both the resonant and anti-resonant frequencies are quite unstable and vary significantly in the dynamic operation of an ultrasonic transducer system. Thus, the impedance at particular frequencies determined to be the average resonance and anti-resonance frequencies is likewise unstable and varies rapidly. It has therefore been the practice in some prior systems to operate the frequency generator above the anti-resonance frequency in a region some distance from the fast changing resonance and anti-resonance peaks, but not so high as to require excessive voltage.

To operate at frequencies above anti-resonance however, conventional systems have employed component inductors and capicators of large capacity and at considerable expense. These components are subjected to high voltage stresses and, accordingly, tend to overheat or arc over. In these prior systems, instability and noise are improved at the expense of requiring physically larger inductances and inordinantly high voltage capacitance.

It is an object of the present invention to provide an improved circuit design for an ultrasonic frequency generator operating at a frequency above anti-resonance. The improvement is achieved by providing a feedback network that is connected in series with the circuitry powering the piezoelectric crystals and by aleviating the requirement of conventional systems for the large capacitor and inductor that are associated with the crystals.

It is also an object of the invention to provide a feedback network in an oscillatory circuit for an ultrasonic generator employing a half bridge squarewave amplifier that compensates for fluctuations in frequency and tends to drive the transducer frequency toward a predetermined target frequency. In providing feedback signals to a half bridge squarewave amplifier, the phase of the feedback signals must lead the amplifier output slightly since there is a lag through the transistors of the amplifier. If the frequency output to the transucers begins to increase above the target frequency, however, retarding the advance of the phase of the feedback tends to bring the frequency back down to the target frequency. Conversely, if the frequency through the transducers begins to drop, a phase advance in feedback to the amplifier brings the frequency of the output thereof back up to the target frequency. The circuitry of the present invention, provides the feature of centering the frequency output of the amplifier about a predetermined target frequency in a self-correcting manner.

DESCRIPTION OF THE DRAWINGS

FIG. 1 is a diagram illustrating crystal system impedance plotted against system frequency in an oscillatory circuit for an ultrasonic frequency generator.

FIG. 2 is a schematic diagram of a frequency generator constructed according to the present invention.

DETAILED DESCRIPTION OF THE DRAWINGS

Referring now to FIG. 1, an impedance response curve 10 conforming generally to that characteristically produced in any one of a number of commercially available ultrasonic frequency crystal systems is depicted. One feature of the curve 10 is the initial downward slope to the point 11 of minimum impedance. This point 11 occurs at the resonance frequency and represents the mechanical resonance of the external metal parts of the transducer and the stiffness of the internal parts, specifically the piezoelectric crystal assembly. The external metal parts may include sets of metal blocks glued to the bottom of a metal tank and between which piezoelectric crystals are belted when the ultrasonic frequency generator is used in an ultrasonic cleaning system.

It should be noted that from the minimum impedance value at 11, impedance rises rapidly with frequency to a maximum peak 12. This maximum peak 12 occurs at the frequency known as anti-resonance. The resonance frequency may, for example, be 31 kilohertz while the anti-resonance frequency may, for example, be 34 kilohertz.

While the curve 10 illustrates generally the relationship between impedance and frequency in a crystal system for an ultrasonic generating system, it does not indicate the impedance oscillations that result when vibrations of the transducer enter the cleaning fluid of an ultrasonic cleaner and are reflected off work load or fluid surfaces and impinge back on the transducers. These reflected waves can arrive in such a phase that they make it easier or more difficult for the transducer to vibrate. They therefore raise or lower the magnitude of impedance at a given frequency. The reflections arrive in a different phase for each frequency, since wave length in the fluid is inversely proportional to frequency. The result of these impedance fluctuations is to superimpose a modified frequency response curve 13 on the curve 10 of FIG. 1. The curve 13 is indicated in phantom lines. The variations in the magnitude of impedance that occur in an ultrasonic generating system can typically increase or decrease the impedance by as much as a factor of two. With these amplitude variations is an associated change in the phase of impedance by as much as 60° leading or trailing the impedance of the curve 10. The pattern 13 of superimposed oscillations on the value of impedance is not constant with frequency, but slides along the underlying curve 10 as the depth of the cleaning fluid in an ultrasonic cleaning system is varied.

The particular frequency generator employed in an ultrasonic cleaner must function in spite of the complexities of the curve 13 to deliver power at as constant a rate as possible and to avoid the excessive generation of noise in an audible range. A simple generator of fixed frequency might vary delivered power by a factor of four or more as the curve 13 varies relative to the curve 10. Also, a frequency generator would have to deliver power over a range of phase angles of at least plus and minus 60°. To accomplish this with a fixed frequency wave generator would be both difficult and inefficient. For these reasons, all commercial generators are closed looped oscillator systems which vary frequency generally in response to changes in load. A half bridge squarewave amplifier with a feedback network from the output is one such system.

Other difficulties arise in the use of closed loop oscillation feedback systems, however. With the oscillation of the phase of impedance that occurs in the superimposition of the curve 13 on the curve 10, there are often a plurality of frequencies close together where the overall phase goes through zero. The closed loop oscillator system seeks a frequency of zero phase, and when more than one point of zero phase exists, the response of the system will jump and jitter continuously among the different points of zero phase. This results in a loss of output power and in the generation of audible noise in the cleaning fluid that is always unpleasant and sometimes intense.

A generator may be designed to stay near series resonance frequency 11 or near anti-resonance frequency 12, but in connection with either frequency, the curve 13 varies rapidly with frequency even if disturbances resulting from reflections are ignored. At frequencies above the frequency 12, large currents must be supplied to the crystal capacitance to develop sufficient voltage to drive the crystals. Those large currents typically go through a power inductor which essentially tunes the crystal capacitance to the desired frequency which may be at the region indicated at the target frequency 14. By employing the circuitry of this invention as depicted, for example, in FIG. 2, operation of the system may be maintained at the region 14, and stabilization of the system at the region 14 may be enhanced.

In addition an overall design may be achieved excluding the need for the addition of capacitance besides that capacitance present in the crystal system itself. This allows the use of a smaller power inductor. A further benefit of designing the system according to the present invention is that the transducer design and frequency area of operation may be chosen in a manner to further reduce the physical size requirement for the inductor.

An oscillatory circuit for an ultrasonic generator according to the present invention is depicted in FIG. 2. In this circuit, 120, 115 or 110 volt, 60 cycle alternating current is applied at the input points 15 and 16. The AC current line employs a fuse 17 and an off on switch 18. The alternating current is feed to a radio frequency interference filter 19 which serves to filter out high frequency noise. The filtered current is applied at the input terminals 20 and 21 to the oscillatory circuit or frequency generator 22 that produces ultrasonic frequency outputs at terminals 23 and 24. The output terminals 23 and 24 are connected to a parallel array of sandwich type piezoelectric transducers, indicated collectively at 26. These transducers may be used as a ultrasonic frequency source in an ultrasonic cleaning device.

Within the oscillatory circuit 22 a rectifier 27 is connected to the input terminals 20 and 21 through a fuse 28. The rectifier 27 employs diodes 29 in a conventional manner. The outputs of the rectifier 27 are passed to another radio frequency interference filter 30 that prevents high frequency currents from going back as interference into the power line through the input terminals 20 and 21. From the radio frequency interference filter 30, rectified voltage is passed to switching transistors 31 and 32. These switching transistors 31 and 32 are connected in a network that is coupled to the rectifier 27 and filter 30. The transistors 31 and 32 are connected in series to each other and to the inputs of a radio frequency transformer 33. The transistors 31 and 32 are cyclically rendered conductive in mutual opposition. That is when the transistor 31 conducts, the transistor 32 does not, and when the transistor 32 conducts, the transistor 31 does not.

The outputs lines 34 and 35 of the radio frequency transformer 33 are series connected to a power inductor 49 and are coupled across piezoelectric ultrasonic transducers 26 through output terminals 23 and 24.

The oscillatory circuit 22 includes a feedback network indicated generally at 36. The feedback network 36 is coupled in series with the ultrasonic transducers 26 for alternatively driving each of the transistors 31 and 32 and for providing a variable phase shift in biasing current thereto. This phase shift tends to hold the cyclic operation of the transistors 31 and 32 at the target frequency 14 indicated in FIG. 1. Feedback signals from the feedback network 36 are generated by the primary **37*a* of the feedback transformer, 37, the portions of the secondary of which are indicated at 37*b* and 37*c* for driving the transistors 31 and 32. A bias to the transistors 31 and 32 respectively is provided by the resistors 38 and 39 to aid in initiating oscillation in the system. Rectifying diodes 40 and 41 and charging capacitors 42 and 43 are provided at the transistor bases as indicated to complete the feedback circuitry. Capacitors 42 and 43 in conjunction with diodes 40 and 41 allow passage of drive currents from windings 37b and 37c while forcing starting currents to enter the transistors 31 and 32 instead of being lost through the windings 37b and 37c**.

The squarewave generating transistors 31 and 32 as powered by the rectifier 27 and the RFI filter 30 form a half bridge squarewave amplifier connected to the radio frequency transformer 33. A blocking capacitor 44 blocks direct current through the RF transformer 33.

The feedback network 36 includes a resistance 45 series connected to the ultrasonic transducers 26. In addition, a capacitance 46 and a feedback inductance 47, together with the feedback transformer 37 are serially connected to each other in parallel with respect to the resistor 45. The effective output resistance of the feedback transformer 37 is indicated in phantom lines at 48. The resistor indicated at 48 is not actually a circuit element in the system, but is merely used to conveniently depict the load actually presented by windings 37b and 37c. The resistance 48 is merely the effective resistance encountered at the secondary windings 37b and 37c which respectively drive the transistors 31 and 32 into a conductive state.

The feedback network of the present invention represents a marked improvement over conventional devices which required a capacitance coupled between the terminals 23 and 24 and another inductance across the terminals of the primary winding 37a of the feedback transformer 37. By eliminating the requirement for a capicator coupled across output terminals 23 and 24, the required size of the feedback inductor 47 is decreased. Even so, the feedback network 36 still performs the function of stablizing oscillator operation by retarding phase with increasing frequency and advancing phase with decreasing frequency at the RF transformer output lines 34 and 35. The feedback network 36 stablizes the operation of the oscillatory circuit 22 without adding capacitance to the output and without requiring the power inductor 49 to be physically as large as would otherwise be required. To the contrary, the individual components of the feedback network 36 are relatively small.

In the feedback network 36, the load current through the transducer crystals 26 is indicated as I. Treating the actual secondary windings 37b and 37c as a single winding with an equivalent load, as indicated by the phantom structure including the resistor 48, the ratio of the primary winding to the single equivalent secondary winding of the transformer 37 may be set at 1:1 for simplicity. In a typical circuit configuration, the value of the resistor 45 is two ohms while the capacitor 46 is rated at 1.1 microfarads. The effective resistance 48 is about 0.15 ohms. Feedback inductance 47 is preferably adjustable so that the oscillatory circuit 22 may be operated at different target frequencies.

The voltage across the resistor 45 varies, but is always small compared to the load voltage. The load current I is therefore substantially unaltered by the presence of the feedback network 36. At the frequency of series resonance of feedback inductor 47 and capacitor 46, the combination of capacitor 46 and feedback inductor 47 has a very low impedance. The current I then divides between the two ohm resistor 45 and the reflected 0.15 ohm resistance indicated at 48. Since the resistance at 48 is much smaller than the resitor 45, the bulk of the load current I flows through the capacitor 46, feedback inductor 47 and feedback transformer 37. At a higher frequency, the circuit branch including capacitor 46, feedback inductor 47 and feedback transformer 37 becomes inductive, and so does the entire feedback network 36. The voltage across the network therefore assumes a leading phase angle relative to I. Substracting the leading current in resistor 45 from I yields a current $i_{FB}$ that lags the load current I. Similarly, a frequency below resonance of feeback inductor 47 and capacitor 46 yields a leading phase for $i_{FB}$. A mathematical analysis of the current relationship shows that the current amplitude through the transformer 37 is governed according to the following equation:

$$\left|\frac{i_{FB}}{I}\right| \frac{R}{\sqrt{(R+r)^2 + X_o^2\left[\frac{f}{fo} - \frac{fo}{f}\right]^2}}$$

In this equation, R is the resistance of resistor 45 and $r$ is the effective resistance at 48. $f_o$ is the frequency to which the capacitor 46 and the feedback inductor 47 are tuned. $X_0$ is the reactance of either the feedback inductor 47 or the capacitor 46 at the frequency fo, while $f$ is the actual frequency that may vary from the target frequency as indicated by the curve 13 in FIG. 1.

The phase of the current through the transformer 37 relative to the load current is given by the following equation:

$$\phi = \mathrm{TAN}^{-1}\left[\frac{Xo\left[\frac{f}{fo} - \frac{fo}{f}\right]}{R+r}\right]$$

Where phi is the phase angle shift of $i_{FB}$ relative to I.

In operation, the oscillatory frequency of the circuit 22 is normally in the range from 37 to 39 kilohertz. Setting the resonance of capacitor 46 and feedback inductor 47 to 42.5 kiolohertz in practice effectively yields a zero phase shift between transistor voltage and current. Since the feedback network 36 produces a phase lead of approximately 20° at nominal operating frequency (38 kilohertz), it follows that the feedback network 36 compensates approximately 20° of phase lag, most of which is due to the non-infinite speed of the transistors 31 and 32. The transistors 31 and 32 are always heavily overdriven and the minor changes in the amplitude of $i_{FB}$ do not change this fact. The foregoing amplitude function therefore has no effect on the system, but the foregoing phase function is significant in that it provides the self-regulating feature of centering the operation of the system about the target frequency. In the example given the target frequency is 38 kilohertz.

The invention is not limited to the particular embodiment depicted in the drawings, but rather is defined in the claims appended hereto.

I claim:

1. In an oscillatory circuit for an ultrasonic generator including a rectifier and filter network for providing a rectified voltage, a transistor network having a pair of transistor arrangements coupled to said rectifier and filter network and in series to each other and connected to inputs of a radio frequency transformer so that said transistor arrangements are cyclically rendered conductive in mutual opposition, and in which outputs of the radio frequency transformer are coupled through a series connected power inductance across piezoelectric ultrasonic transducer means, the improvement comprising feedback network means coupled in series with said ultrasonic transducer means and including a resistance series connected to said ultrasonic transducer means, and a capacitance, a feedback inductance, and a feedback transformer series connected to each other and in parallel with respect to said resistance for alternatively driving each of said transistor arrangements and for providing a variable phase shift in driving current thereto tending to hold the cyclic operation of said transistor arrangements at a target frequency.

2. The oscillatory circuit of claim 1 wherein said feedback inductance is adjustable.

3. The oscillatory circuit of claim 1 wherein said resistance is two ohms, said capacitance is 1.1 microfarads, said feedback transformer has an effective resistance of 0.15 ohms, and said target frequency is about 38 kilohertz.

4. The oscillatory circuit of claim 1 further characterized in that the instantaneous phase shift of current through said feedback transformer relative to current through said piezoelectric transducer means is an angle the negative of the tangent of which is the quotient of the fraction having as a numerator the product of the reactance of said capacitance at the network operating frequency multiplied by the quantity of the ratio of instantaneous frequency divided by target frequency less the ratio of target frequency divided by instantaneous frequency and having as a denominator the sum of said resistance and effective resistance of said feedback transformer.

5. In a frequency generator for use in an ultrasonic cleaning device comprising a half bridge squarewave amplifier and a radio frequency transformer connected to piezoelectric transducer means and having a feedback connection to said half bridge squarewave amplifier, the improvement comprising a feedback network connected in series with said piezoelectric transducer means as part of said feedback connection and comprising a resistance connected in parallel with the serially connected combination of a capacitance, a feedback inductance, and a feedback transformer for providing a variable phase shift in driving current to said half bridge squarewave amplifier tending to hold frequency generation therein at a target frequency.

6. The frequency generator of claim 5 further comprising a primary inductance connected between said radio frequency transformer and said piezoelectric transducer means and wherein said primary inductance, said resistance, said capacitance, and said feedback transformer are selected to hold said target frequency stabilized at a frequency above anti-resonance frequency.

* * * * *